US005755881A

United States Patent [19]

Fenoglio et al.

[11] Patent Number: 5,755,881

[45] Date of Patent: May 26, 1998

[54] APPARATUS FOR REMOVING MATERIAL FROM A COATED MOVING WEB AND COATING APPARATUS USING SUCH APPARATUS

[75] Inventors: Alfredo Fenoglio, Savona; Luigi Gallo, Ferrania; Pietro Prato, Carcare, all of Italy

[73] Assignee: Minnesota Mining and Manufacturing Company, Saint Paul, Minn.

[21] Appl. No.: 699,453

[22] Filed: Aug. 19, 1996

[30] Foreign Application Priority Data

Oct. 19, 1995 [EP] European Pat. Off. ........... 95116479.7

[51] Int. Cl.$^6$ .............................. C23C 14/00

[52] U.S. Cl. .............................. 118/50; 118/67; 118/68; 118/69; 118/325; 118/419; 427/350; 427/398.1

[58] Field of Search .............................. 118/663, 679–681, 118/50, 67–69, 123, 324, 325, 419; 427/350, 398.1, 374.3; 162/363, 374, 364

[56] References Cited

U.S. PATENT DOCUMENTS

| | | | |
|---|---|---|---|
| 2,767,617 | 12/1956 | Taylor | 89/33 |
| 2,899,339 | 8/1959 | Rakus | 117/102 |
| 3,459,153 | 8/1969 | Alix | 118/102 |
| 3,526,204 | 9/1970 | Schnedler | 118/8 |
| 3,900,866 | 8/1975 | Bell et al. | 118/50 |
| 4,019,096 | 4/1977 | Bullinga | 361/86 |
| 4,102,299 | 7/1978 | Wallsten | 118/50 |
| 4,177,754 | 12/1979 | James et al. | 118/67 |
| 4,340,621 | 7/1982 | Matsumiya et al. | 427/294 |
| 4,416,919 | 11/1983 | Beck | 427/296 |
| 4,611,553 | 9/1986 | Iwata et al. | 118/50 |
| 5,358,737 | 10/1994 | Mues et al. | 427/177 |
| 5,614,023 | 3/1997 | Takahashi et al. | 118/413 |

FOREIGN PATENT DOCUMENTS

| | | |
|---|---|---|
| 2086445 | 7/1994 | Canada . |
| 0 006 763 | 9/1980 | European Pat. Off. . |
| 0 300 098 | 1/1989 | European Pat. Off. . |
| 11 14 161 | 9/1961 | Germany . |
| 56-073579 | 6/1981 | Japan . |
| 407 823 | 9/1966 | Switzerland . |

OTHER PUBLICATIONS

*Modern Coating and Drying Technology*, Edward Cohen & Edgar Gutoff, VCH Publishers, New York 1972.

*Research Disclosure Bulletin*, Item No. 18214 (Jun., 1979).

*Primary Examiner*—Laura Edwards

*Attorney, Agent, or Firm*—William D. Bauer

[57] ABSTRACT

Apparatus for removing an excess amount of a liquid coating material from portions of a moving web following coating of the moving web with the liquid coating material along a coating path. A vacuum head having a suction slot is defined by upstream and downstream walls and adapted to be movably positioned in an inoperative position away from the coating path and in an operative position contacting at least a portion of the liquid coating material on the moving web along the coating path, the downstream wall positively displacing a portion of the liquid coating material when the vacuum head is positioned in the operative position. A suction mechanism is operatively coupled to the vacuum head for establishing a vacuum manifold within the suction slot and communicating with a disposal system. A supply of liquid is operatively coupled to the vacuum head for supplying liquid to the suction slot.

12 Claims, 4 Drawing Sheets

APPARATUS FOR REMOVING MATERIAL FROM A COATED MOVING WEB AND COATING APPARATUS USING SUCH APPARATUS

TECHNICAL FIELD

The present invention relates generally to coating apparatus which coat moving webs with liquid coating material and, more particularly, to apparatus, associated with such coating apparatus, for removing such material from such a coated moving web.

BACKGROUND OF THE INVENTION

It is a common manufacturing or treatment process to coat a web with one or more layers of a liquid coating material. Commonly, the web being coated is transported through the manufacturing process on a flexible movable substrate, such as a conveyer belt. Flexible moving substrates used in manufacturing processes for coated webs are well known in the art. During the coating process, the liquid coating material is deposited on the moving web in at least one of several well known coating operations. Devices such as cascade hoppers or slot coaters, well known in the art, are often used for this purpose.

An example of a coating process is the coating of polyester, cellulose triacetate, paper or PEN with multiple layers of photographic emulsions or antihalo layers during the manufacture of photographic film. Such processes are generally described in U.S. Pat. No. 2,767,617, Russel et al.

Usually during the manufacturing process, the moving web passes through a drying process in which the liquid coating material deposited on the moving web is dried, or partially dried, prior to subsequent manufacturing processes or prior to winding the web onto a roll for shipment or subsequent use. Such drying operations and drying devices are also well known in the art. An example of such drying operations are described in Cohen and Gutoff, *Modern Coating and Drying Technology*, VCH Publishers, New York (1972).

During an initial start-up of or other transient operation during such a manufacturing or treatment process, conditions may exist in the coating and/or drying processes which do not necessarily exist at steady state. Typically, a transient condition existing during such an operation is the deposition of more too great of a material which can be reasonably dried or the speed of the process is too fast to allow proper drying of the material coated onto the web. In either event, improper drying may occur which leads to the possibility of several unfortunate events. First, improper drying means that wet or liquid material exists on the web at the end of a particular manufacturing process. Since, the web is commonly wound on a roll to subsequent use or processing, such winding with wet material causes the material to be tracked off onto the reverse side of the web material or to be tracked off onto rollers associated with the manufacturing process. In either case, the excess wet liquid coating material contaminates itself or manufacturing equipment. This may require forced downtime on the equipment and/or scrapping the web material just coated. Second, improper drying may occur also at the edges where additional thickness an be produced by the coating process. This additional material may cause additional thickness in that portion of the web which can result in uneven winding of the web onto a take-up roll with expected undesirable results.

Many known approaches tend to minimize the formation of heavy liquid layers, especially heavy edges, at the coating start position. Since industrial dryers are designed to remove solvent from coated layers in steady conditions, thicker coating spot occurring at start up, or other transient, conditions can escape from the drying process and subsequently track off and release coated material on rollers forming the substrate support line downstream from the drier. Tracked off coated material is generally transferred back to the coated surface in a later stage originating defects or forcing production to be stopped to allow cleaning of the surface of the affected rollers.

Typically, it is a goal in manufacturing processes to run the process as fast as possible in order to achieve the best throughput. To be able to run a coating process as fast as possible, it is necessary to adjust the coating thickness, drying amount and web speed. If transient conditions are present during the coating process and improper drying occurs, equipment downtime or finished (or partially finished) goods may be ruined even though the manufacturing process operates perfectly normally at steady state.

Previous devices and techniques have attempted to solve the uneven coating and improper drying of coated webs. Many of these previous solutions try to optimize transient conditions during start up such as electrostatic treatment of the flexible substrate, applying a vacuum to the forming bead, making variations in the geometry between the hopper coater and the substrate and the adjustment of flow rates of the liquid layer(s) forming the bead. Examples are found in European Patent Application No. 0 300 098 and U.S. Pat. No. 4,340,621.

U.S. Pat. No. 4,416,919, describes a system which detects the presence of thickenings in the coated layers at the end of the drying stage. If thick edges are detected, two air jets blow the excess material on the thick edges into a vacuum tank which is sprinkled with water and the water and excess particles are supplied to a vacuum device which, in turn, is evacuated by a jet suction device.

Also, U.S. Pat. No. 3,526,204, Schnedler, Edge Thickness Control for Liquid Coating Operation, filed Sep. 13, 1967, discloses a method and apparatus for continuously coating a web of material and controlling coating thickness at the edges of the web by providing a fluid jet transversely of the web and increasing the jet wiping action in a narrow zone adjacent the edges of the web. In an embodiment, a nozzle extension increases the wiping action of the jet on the edges of the web where excessive coating thickness might otherwise occur. The wiping action is increased by either bringing the jet closer to the web or reducing the angle between the jet and the web. Schnedler attempts to solve this problem by changing the conditions of an already existing fluid jet along the edge conditions of the web or by transversely extending the substrate on which the web is supported.

*Research Disclosure Bulletin*, Item No. 18214 (June, 1979), discloses a technique for reducing or eliminating edge beads in slide hopper coating by making the distance between the guide faces of edge guides for the coating layer on the inclined surface slightly greater than the length of the slot-like orifice, and by producing two narrow bands of liquid between the edges of the formed coating layer and the edge guides. Research Disclosure Bulletin attempts to solve this problem by adjusting the coating conditions in edge zones to allow for a less viscous edge condition which can be easily removed from the web.

U.S. Pat. No. 4,019,906, Ridley, Curtain Coating Method, filed Oct. 11, 1974, discloses a method of coating a traveling web with at least one layer of liquid coating composition, including the steps of moving the web along a path through a coating zone and forming at the coating zone a free falling vertical curtain which extends transversely of the path and impinges the traveling web to deposit thereon a coating. The free falling curtain is composed of at least two separately formed free falling curtains which are joined edge to edge, one partial curtain constituting an edge region of the integral curtain and the other or others constituting a central region and another region for the integral curtain. Ridley attempts to solve this problem by changing the characteristics of the coating operation in edge regions.

Other devices have attempted to solve the problem by altering the web downstream of the coating process. U.S. Pat. No. 3,459,153, Alix, Apparatus for Prevention of Edge Bead on Curtain Coated Surfaces, filed Dec. 29, 1966, discloses an apparatus for preventing edge bead formation on substrates including scraping blade placed adjacent the edges of the substrate just downstream from a curtain of coating material falling from a coating head. The blade is supported by a curved flexible member which also serves to support the edge of the substrate. Alix attempts to solve this problem by adding a scraping blade downstream of the coating curtain.

Also, European Patent Application No. 0 006 763, Zink, Dual Blade Coater, published Jan. 9, 1980, discloses a dual blade fountain coater for simultaneously coating opposite sides of a moving web of paper including a pair of oppositely positioned, non-contacting fountains and a pair of oppositely positioned metering blade assemblies which are mounted for movement about a common transverse pivot axis. The pivot axis is substantially coincidental with the blade contacting region on the web. Each assembly is independently adjustable of the other for adjusting blade angle and each fountain is similarly independently adjustable for varying the coating contacting region and dwell time. Each blade may use a metering blade. Zink attempts to attack the problem of edge build-up in dual blade web coaters by providing edge blades which are specially aligned and specially pivotable.

All of these documents attack the down-web side edges developing all along the coated web because of the coating irregularities such as "necking in" of the liquid coating material in the bead portion of the coater. These documents do not solve the problem of cross-web edges occurring at start up or during other transient conditions during coating.

U.S. Pat. No. 5,358,737, Mues et al, Method of Brushing Incompletely Dried Coating Regions from a Coated Web, filed Jun. 14, 1993, assigned to Agfa-Gevaert NV, discloses a coating system for applying to a face of a moving continuous web a coating of predetermined thickness of a liquid coating composition, thereafter drying the thus-coated web under substantially constant drying conditions, and collecting the dried coated web on a take-up roll. Portions exceeding the predetermined thickness which would not be completely dried and, hence, would adhere to and contaminate surfaces coming in contact therewith are removed from the coating. A web wiping means contacts excessively thick regions of the coating which is adapted to be displaced from an inoperative position remote from the web to an operative position contacting the excessively thick regions of the coating. The displacement is activated in response to the detection on the web of excessively thick coating regions. The web wiping means is driven in its operative position in a continuous, e.g., circular, path having a locus intersecting the web path and preferably is a cylindrical brush of flexible bristles. The removed coating portions may be cleaned from the wiping means, e.g., by a scraper and aspirated away by suction. Mues et al attempts to solve this problem by brushing the non-uniform coated surface with a cylindrical brush. A knife may assist in removing the excessively thick coating portions. Partially removed coating material may then be continuously evacuated. The brush positioned in an inoperative position until the process senses that the coating has a non-uniform coating due to inadequate drying at which time the brush is brought into an operative position with respect to the web.

Reference is made in Mues et al to known methods for alleviating heavier or thicker web coatings due to start-up or disturbance of the process so that the web coatings are insufficiently dried. Some known methods are the use of a suction device adjacent the coating apparatus which acts as a vacuum cleaner on demand to suction off excess fluid from the web surface. This, however, requires cleaning of the suction tube after each operation to ensure that there are no lingering speck particles of the coating material which may dry out and impede the suctioning system.

Canadian Patent No. 2,086,445, Barr, discloses a miniature vacuum cleaning system, e.g., for use in photographic and electronics industries. The system includes a number of separate probes which are attachable to a support head and which can be manipulated in a manner of a writing implement and including a hose connected to an existing vacuum system. Some of the probes are formed from a tube with a resilient coating at the end of the tube for engaging the surface. Other probes have a sweeping surface on which is attached a loop pile fabric.

Manually operated "hopper lips" can be used to remove droplets trapped in the bead region of slide coaters and typically are smaller than the width of moving web. Manual use of this device leads to diagonal thick edge in the coating layer.

SUMMARY OF THE INVENTION

The apparatus provided by the present invention is not only much simpler than most of the previous devices (it does not require a thickness detector, for example). When the apparatus of the present invention is utilized, coated liquid is removed and overthickness does not remain, even at the locations where the apparatus first operates on the moving web or where the apparatus ceases operating on the moving web. The apparatus of the present invention provides a unique and advantageous way of eliminating not only overthickness of liquid coating materials but also initial overthickness across the web due to start up or other transient conditions existing during coating.

Since the apparatus of the present invention, preferably, first undergoes liquid removal before the coated moving web undergoes active drying, the complete drying of any remaining liquid coating or of the drying of previous coatings is ensured. This also allows the operator of the manufacturing process to easily check the processes performance since the liquid remover is physically located between the coater and the dryer and, hence, physically near the coater which may need to be manually adjusted rather than after a possibly geometrically lengthy drying apparatus.

In a preferred embodiment the present invention provides an apparatus for coating a moving web with a liquid coating material. A transport means transports the moving web along a coating path. A coating means positioned along the coating path applies the liquid coating material to the moving web. A removal means is adapted to be movably positioned in an inoperative position away from the coating path and in an operative position along the coating path for operatively removing at least a portion of the liquid coating material from the moving web. A drying means is positioned along the coating path and downstream from the removal means for drying the liquid coating material still contained on the moving web. The removal means has a vacuum head having a suction slot defined by an upstream wall and a downstream wall and side walls, the downstream wall positively displacing a portion of the liquid coating material when the removal means is positioned in the operative position, a suction means operatively coupled to the vacuum head for establishing a vacuum manifold within the suction slot and communicating with a disposal system; and a liquid supply means operatively coupled to the vacuum head for supplying liquid to the suction slot.

In an alternative embodiment the present invention provides an apparatus for removing an excess amount of a liquid coating material from portions of a moving web following coating of the moving web with the liquid coating material along a coating path. A vacuum head having a suction slot defined by upstream and downstream walls is adapted to be movably positioned in an inoperative position away from the coating path and in an operative position contacting at least a portion of the liquid coating material on the moving web along the coating path, the downstream wall positively displacing a portion of the liquid coating material when the vacuum head is positioned in the operative position. A suction means is operatively coupled to the vacuum head for establishing a vacuum manifold within the suction slot and communicating with a disposal system. A liquid supply means operatively coupled to the vacuum head for supplying liquid to the suction slot.

Preferably, the liquid being supplied by the liquid supply means is water. Preferably, the vacuum head further contains a distribution cavity communicating with the suction slot and wherein the liquid supply means supplies the water to the distribution cavity for subsequently distribution to the suction slot. Preferably, the water has a temperature greater than ambient. Preferably, the temperature of the water is at least 40 degree Centigrade in the distribution cavity.

Preferably, the downstream wall of the vacuum head extends beyond the upstream wall of the vacuum head, and, additionally preferably so extends by not less than 0.1 millimeters and not more than 5 millimeters.

Preferably, the suction slot has a width of not less than 0.1 millimeters and not more than 5 millimeters. Preferably, the removal system is positioned along the coating path immediately downstream from the coating means. Preferably, the transport means is a flexible support substrate. Preferably, the downstream wall of the vacuum head interferes with the coating path of the moving web by not more than 10 millimeters.

BRIEF DESCRIPTION OF THE DRAWINGS

The foregoing advantages, construction and operation of the present invention will become more readily apparent from the following description and accompanying drawings in which.

DETAILED DESCRIPTION OF THE PREFERRED EMBODIMENTS

U.S. Pat. No. 2,767,617, Russel et al. describes a photographic film constructed of a base layer, polyester, cellulose triacetate, paper or PEN, coated with a number of individual coatings or with a number of individual layers coated simultaneously in a multi-layer stack. Most of these coatings are applied to the base layer, or base layer and underlying coatings, as a liquid material which is then dried to form either a base for a subsequent layer or a finished photographic film product. An example of a material which is coated on such base layer is silver halide crystals dispersed in a colloidal medium to form a photosensitive layer in an X-ray, graphic arts or color film.

Figure 1:
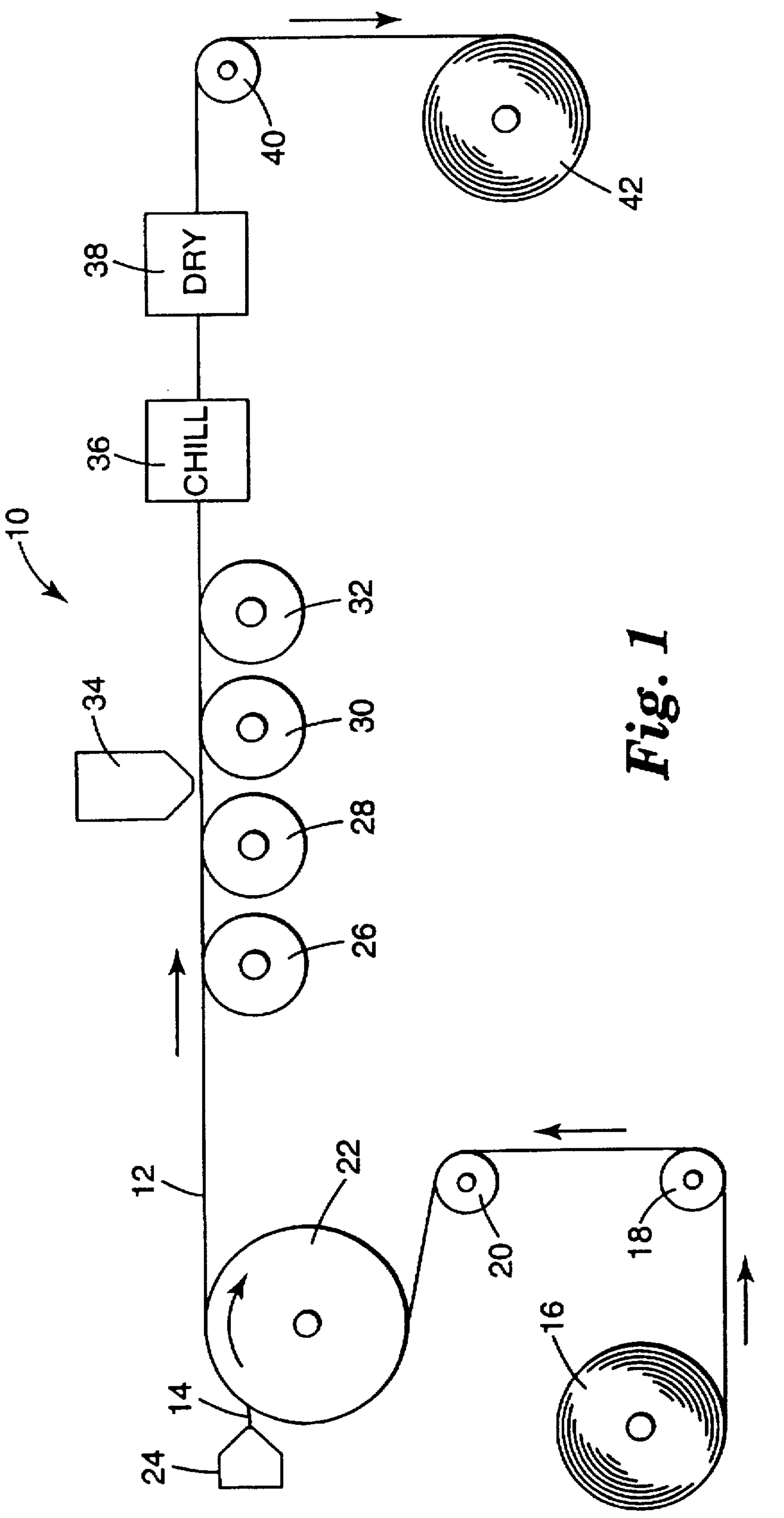
FIG. 1 is a diagrammatic view of an apparatus for coating a moving web with a liquid coating in accordance with the present invention.

The apparatus and process of coating one of such layers or multiple layers is illustrated in greatly simplified form in FIG. 1. Apparatus 10 for coating is arranged to coat moving web 12 with a liquid coating material 14. Web 12 is supplied from supply roll 16 and transported around idler roller 18 and idler roller 20. Web 12 is formed around coating roller 22. At this point, coating station 24 applies liquid coating material 14 to web 12. Coated web 12 passes over a series of supporting rollers 26, 28, 30 and 32. Removal apparatus 34, positioned downstream from coating station 24, can remove some or all of liquid coating material 14 from web 12 before web 12 passes on the chilling station 36 and drying station 38. Finally, web 12 passes over another idler roller 40 and onto take up roll 42. The drive mechanism for imparting movement to web 12 and causing web 12 to move along a coating path from supply roll 16, past coating station 24, removal station 34, chilling station 36, drying station 38 to take up roll 42 can be achieved by actively rotating take up roll 42 or by conventional drive rollers (not shown). It is also well understood that web 12 may be supported by a flexible drive belt (not explicitly shown) following a path coincident with the coating path of web 12 except for supply from supply roll 16 and winding on take up roll 42.

Coating station 24, chilling station 36, drying station 38 as well as the drive and transport mechanisms illustrated in FIG. 1 are well known in the art. The particular form of these elements is not crucial to the success of removal station 34 and the operation of apparatus 10. However, an exemplary process describing these elements in more detail is illustrated and described in U.S. Pat. No. 2,767,617, Russel et al.

In operation, apparatus 10 coats web 12 with liquid coating material 14. While the coating process is occurring, web 12 is continuously driven from supply roll 16 through the various processing stations to take up roll 42. It is advantageous, of course, to have a manufacturing process which operates as quickly and as efficiently as possible. To this end, it is desirable to increase the speed of travel of web 12 through apparatus 10. However, if the speed of transport of web 12 is too fast, chilling station 36 and drying 38 may be insufficient to completely dry liquid coating material 14 before take up roll 42 is reached.

When apparatus 10 is operating in steady state, the parameters of coating station 24 have been adjusted conventionally, the speed of transport of web 12 has been adjust conventionally and the operation of chilling station 36 and drying station 38 have all been adjusted conventionally so that the throughput of apparatus is maximized while liquid coating material 14 is dried sufficiently before web 12 reaches take up roll 42. Such adjustments are well known in the art.

However, when apparatus 10 is just beginning operation at start up, or during any other transitional period of operation of apparatus 10 such as coating over splices on the web. additional liquid coating material 14 may be applied to web 12, the speed of transport of web 12 may be too great, chilling and/or drying may be insufficient and, until these parameters can be conventionally adjusted, web 12 is moving through apparatus 10 toward take up roll 42 with liquid coating material 14 not being sufficiently dried. As web 12 reaches take up roll 42, or at any other critical point in the processing of apparatus 10, insufficiently dried liquid coating material 14 may be tracked off web 12 onto a previously wound layer of web 12 on take up roll 42 or onto other processing equipment. The result of such tracking off of liquid coating material 14 is that apparatus 10 may have to be stopped to clean the processing equipment or the portion of web 12 already wound on take up roll 42 may be ruined. If apparatus 10 is stopped for cleaning, it must, of course, be restarted for subsequent coating of web 12 resulting in the possibility of still further transient unwelcome conditions.

Thus, removal station 34 is important in the operation of apparatus 10. Located along coating path of web 12 between coating station 24 and chilling station 36 and drying station 38, removal station 34 can, optionally, remove some or all of liquid coating material 14 from web 12 during such transient conditions. During steady state conditions, it is expected that removal station 34 will be inactive and perform no operation upon web 12. However, during transient conditions, removal station 34 is activated and operates to remove all or a portion of liquid coating material 14 from web 12 before drying. Since, liquid coating material is removed from web 12 before drying, complete drying of any remaining liquid coating material in drying station 38 is assured even in transient conditions. Once steady state conditions are achieved in apparatus 10, removal station 34 is inactivated and liquid coating material 14 is allowed to remain on web 12. Thus, removal station 34 acts as a preventive safety element which allows the normal transient and/or startup conditions of apparatus 10 to be conventionally worked out without risking inadequate drying of liquid coating material 14 and resultant maintenance of apparatus 10 or spoilage of web 12.

Figure 2:
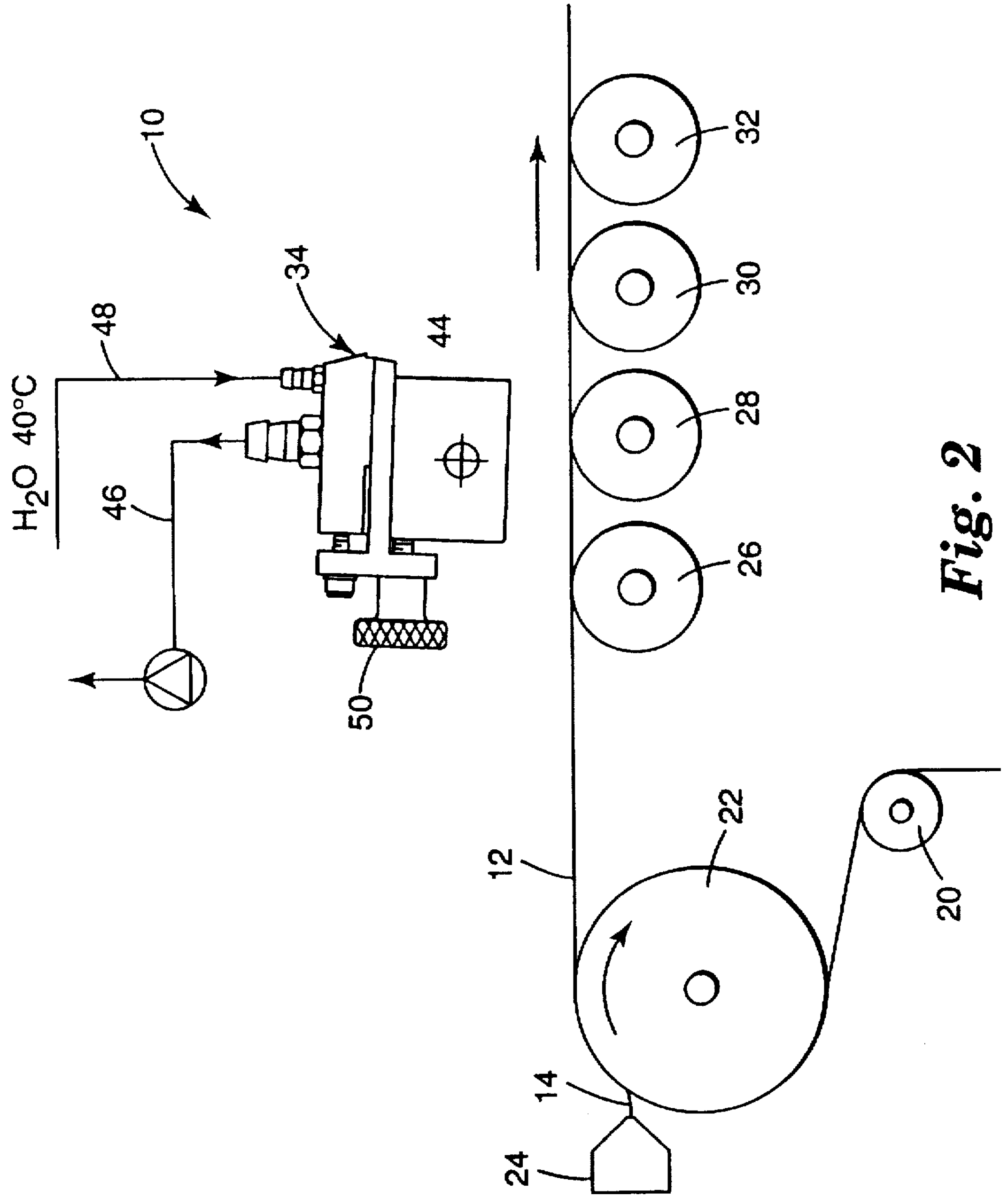
FIG. 2 is an expanded detail of the portion of the apparatus of FIG. 1 detailing the coating and removing sections.

The operation of removal station 34 can be more readily appreciated by reference to FIG. 2 which shows a portion of apparatus 10 in more detail. Again, following coating in coating station 24, web 12 passes over support rollers 26, 28, 30 and 32. Removal station 34 is positioned to act on web 12 between support roller 28 and 30 along coating path of web 12 downstream from coating station 24. Removal station 34 pivots about rotation point 44. In FIG. 2, removal station 34 is shown rotated ninety degrees in the counterclockwise direction from its activated position. Removal station is shown connected both to a vacuum supply line 46 and a water supply line 48.

Figure 3:
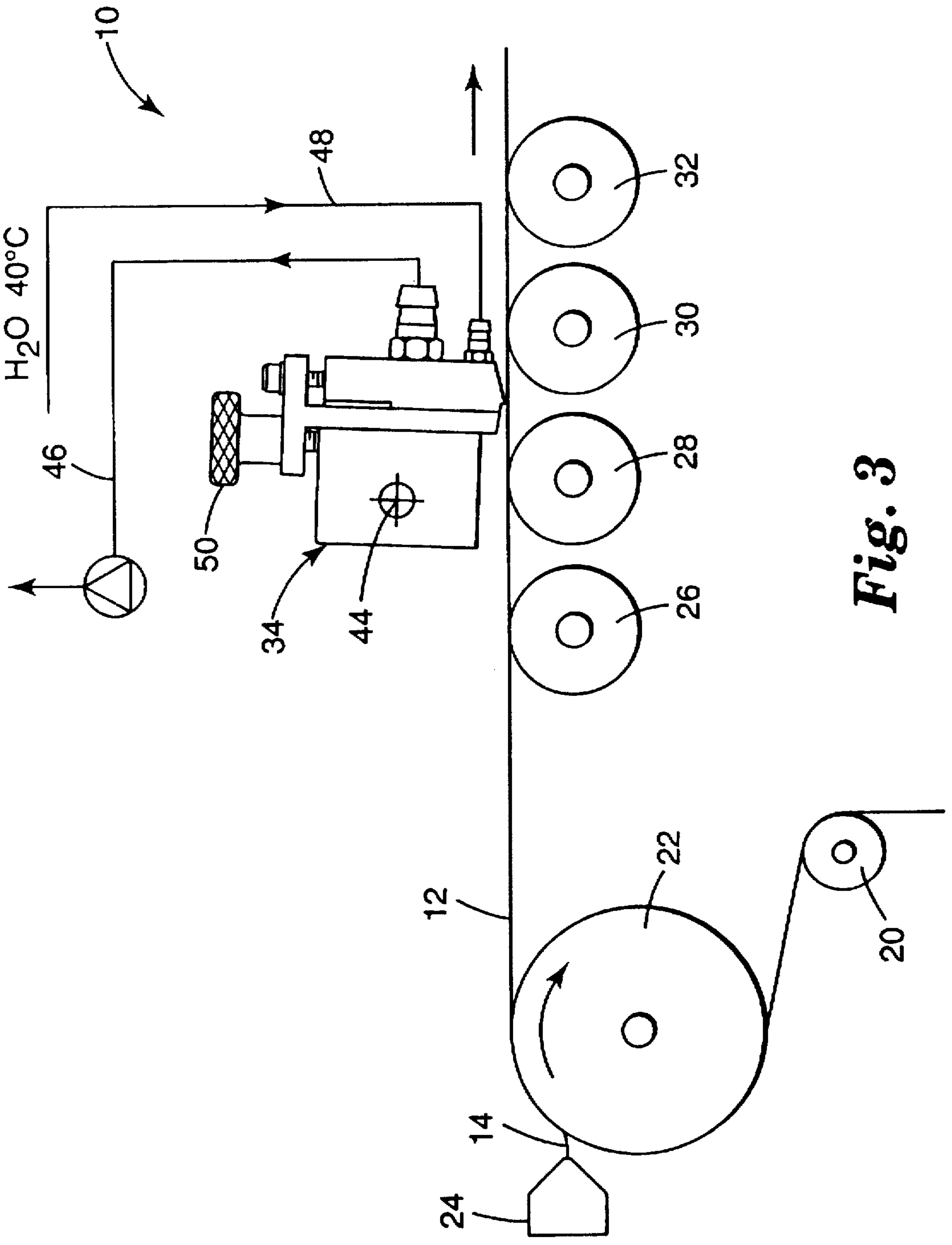
FIG. 3 is an expanded detail of the portion of the apparatus of FIG. 1 detailing the coating and removing sections.

FIG. 3 shows the portion of apparatus 10 illustrated in FIG. 2 but this time with removal station 34 illustrated in an active position. Again, following coating in coating station 24, web 12 passes over support rollers 26, 28, 30 and 32. Removal station 34 is positioned, adjusted by knob 50, to act on web 12 between support roller 28 and 30 along coating path of web 12 downstream from coating station 24. Removal station 34 has been pivoted about rotation point 44 approximately ninety degrees in the clockwise direction from the inactive position previously illustrated in FIG. 2. Removal station is shown connected both to a vacuum supply line 46 and a water supply line 48.

When an operator senses that transient conditions are present or are about to be present in apparatus 10, removal station 34 is rotated to the active position illustrated in FIG. 3. Removal station 34 operates to provides a vacuum, by way of suction line 46, at suction slot 52 positioned in proximity with the coated surface of web 12. Simultaneously, removal station 34 is provided with a supply of liquid from water supply line 48.

Figure 4:
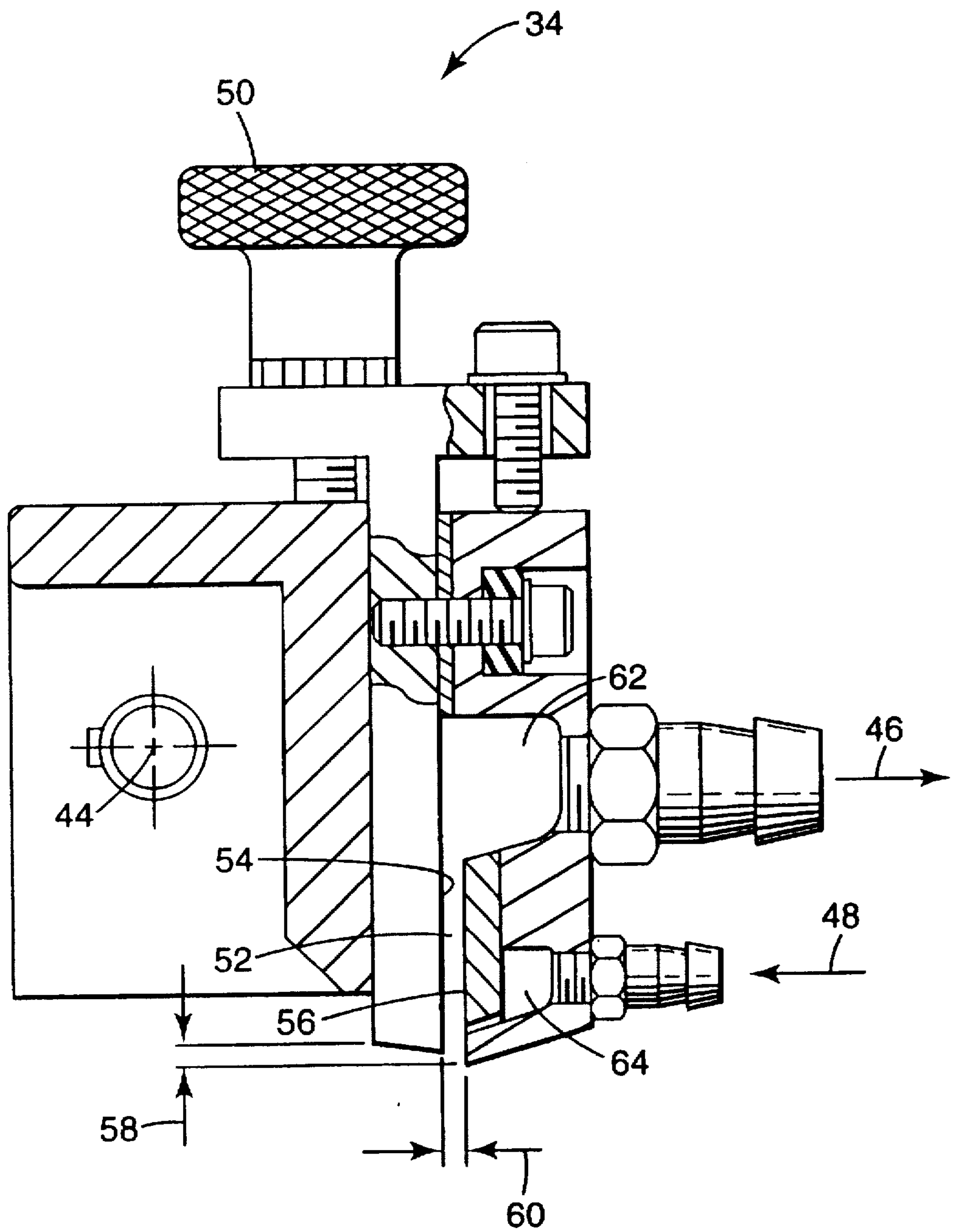
FIG. 4 is a transverse view of the vacuum head of the present invention used in the apparatus of FIG. 1.

The structure of removal station 34 is illustrated in FIG. 4. Suction slot 52 is formed by upstream wall 54 and downstream wall 56. Downstream wall 56 extends downwardly by an amount 58 in FIG. 4 below the lowest extent of upstream wall 54. This allows removal station 34 to be positioned between rollers 28 and 30 (illustrated in FIGS. 2 and 3) and with downstream wall 56 contacting, or interfering with coating path of web 12. Preferably, this places downstream wall 56 in contact with liquid coating material placed on web 12 by coating station 24 (FIGS. 2 and 3). Preferably, the amount 58 that downstream wall 56 extends closer toward web 12 is from about 0.1 millimeters to about 5 millimeters with 0.5 millimeters being preferred. The amount of such interference may be none to up to about 10 millimeters with 1 millimeter being preferred. The width of suction slot 60 is preferably in the range from 0.1 millimeters to 5 millimeters, and still more preferably from 0.2 millimeters to 2 millimeters, with 1 millimeter being preferred. It is recognized that web 12 may be placed under a slight vacuum in order to ensure that web 12 is held against rollers 26, 28, 30 and 32 and to ensure that rollers 26, 28, 30 and 32 roll with and do not scratch web 12. In such a case web 12 is actually deflected downward slightly by the vacuum pressure rather than being a generally straight line as illustrated in FIG. 1. In such case, web 12 preferably is held under tension at removal station 34 by at least 0.01 kilograms per centimeter width, preferably by about 0.4 kilograms per centimeter width. The amount of interference discussed above applies to the actual position of web 12 at removal station 34 whether or not va-cuum is applied and whether or not web 12 is straight or deflected.

Suction slot 52 communicates with vacuum manifold chamber 62 which is adapted to be connected to vacuum supply line 46. Preferably, vacuum manifold chamber supplies a vacuum to removal station 34 of from about 100 to about 650 millimeters Hg with 500 millimeters Hg being preferred.

Water above ambient temperature, preferably about 40 degrees Centigrade, is supplied to removal station 34 by way of water supply line 48. While water is the preferred liquid, it is to be recognized and understood that other liquids may be employed as well depending upon the liquid coating material 14 being used. Water from water supply line 48 enters distribution cavity 64 prior to being distributed into suction slot 52. The hot water is used to dilute liquid coating material 14 and flush suction slot 52, vacuum chamber 62 and suction line 46 during operation. Preferably, water flow rate can be varied from about 3 grams/minute-cm to about 100 grams/minute-cm, with 25 grams/minute being preferred. Water from water supply line 48 should be under relatively little pressure compared to ambient room pressure, and preferably, should be close to zero. Thus, water pressure from a typical commercial or industrial water supply source should be reduced in pressure such as by a laminating valve or by free surface tank.

Distribution cavity 64 communicates with suction slot 52 via distribution ducts 66 which relatively evenly distribute water from distribution cavity 64 across the width of web 12. Distribution ducts 66 should be located closer to the edge of suction slot 52 which meets web 12 than vacuum chamber 62. This will ensure that the upper portion of suction slot 52 and the vacuum chamber 62 will be flushed with water or other appropriate liquid. In fact, it is preferred that distribution ducts 66 be located as close as reasonably possible to the edge of suction slot 52 which meets web 12 to flush as much of suction slot 52 as possible.

In operation, liquid coating material 14 travels with web 12 towards suction slot 52. A negative pressure is established in vacuum chamber 62 and through suction slot 52. Liquid coating material 14 from web 12 is displaced from web 12 by downstream wall 56 which either touches or comes very near to the surface of liquid coating material 14 on web 12. Because of the differential pressure established through suction slot 52, liquid coating material 14 is forced into removal station 34 and drained away in suction line 46.

Removal station 34 has been tested in operation up to a suction capacity of liquid coating material 14 per unit width exceeding 150 grams/minute-centimeter at substrate speeds from 10 to 300-meters/minute.

While the present invention has been described with respect to it preferred embodiments, it is to be recognized and understood that changes, modifications and alterations in the form and in the details may be made without departing from the scope of the following claims.

We claim:

1. An apparatus for coating a moving web with a liquid coating material, comprising:

transport means for transporting said moving web along a coating path;

coating means positioned along said coating path for applying said liquid coating material to said moving web;

removal means movably positioned in an inoperative position away from said coating path and in an operative position along said coating path for operatively removing at least a portion of said liquid coating material from said moving web; and drying means positioned along said coating path and downstream from said removal means for drying said liquid coating material still contained on said moving web;

said removal means comprising:

a vacuum head having a suction slot defined by an upstream wall and a downstream wall and side walls, said downstream wall positively displacing a portion of said liquid coating material when said removal means is positioned in said operative position;

suction means operatively coupled to said vacuum head for establishing a predetermined negative with respect to ambient pressure in a vacuum manifold within said suction slot and communicating with a disposal system; and liquid supply means operatively coupled to said vacuum head for supplying liquid to said suction slot.

2. An apparatus for coating a moving web as in claim 1 wherein said liquid being supplied by said liquid supply means is water.

3. An apparatus for coating a moving web as in claim 2 wherein said vacuum head further comprises a distribution cavity communicating with said suction slot and wherein said liquid supply means supplies said water to said distribution cavity for subsequently distribution to said suction slot.

4. An apparatus for coating a moving web as in claim 3 wherein said water has a temperature greater than ambient.

5. An apparatus for coating a moving web as in claim 4 wherein said temperature of said water is at least 40 degree Centigrade in said distribution cavity.

6. An apparatus for coating a moving web as in claim 1 wherein downstream wall of said vacuum head extends beyond said upstream wall of said vacuum head.

7. An apparatus for coating a moving web as in claim 6 wherein said downstream wall extends beyond said upstream wall of said vacuum head by not less than 0.1 millimeters and not more than 5 millimeters.

8. An apparatus for coating a moving web as in claim 1 wherein said suction slot has a width of not less than 0.1 millimeters and not more than 5 millimeters.

9. An apparatus for coating a moving web as in claim 8 wherein said suction slot has a width of not less than 0.2 millimeters and not more than 2 millimeters.

10. An apparatus for coating a moving web as in claim 1 wherein said removal means is positioned along said coating path immediately downstream from said coating means.

11. An apparatus for coating a moving web as in claim 10 wherein said transport means is a flexible support substrate.

12. An apparatus for coating a moving web as in claim 11 wherein said downstream wall of said vacuum head interferes with said coating path of said moving web by not more than 10 millimeters.

* * * * *